(12) United States Patent
Chen

(10) Patent No.: US 9,748,171 B2
(45) Date of Patent: Aug. 29, 2017

(54) MEMORY STRUCTURE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/865,034

(22) Filed: Sep. 25, 2015

(65) Prior Publication Data

US 2017/0092632 A1  Mar. 30, 2017

(51) Int. Cl.
| | |
|---|---|
| H01L 27/11551 | (2017.01) |
| H01L 23/528 | (2006.01) |
| H01L 27/11521 | (2017.01) |
| H01L 27/11526 | (2017.01) |
| H01L 27/11556 | (2017.01) |
| H01L 27/11568 | (2017.01) |
| H01L 27/11573 | (2017.01) |
| H01L 27/11582 | (2017.01) |

(52) U.S. Cl.
CPC ...... *H01L 23/528* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 27/11582* (2013.01)

(58) Field of Classification Search
CPC ................................................ H01L 27/11531
See application file for complete search history.

(56) References Cited

U.S. PATENT DOCUMENTS

| | | | | |
|---|---|---|---|---|
| 8,987,787 | B2 | 3/2015 | Chen et al. | |
| 2016/0099066 | A1* | 4/2016 | Dunga | G11C 16/24 |
| | | | | 365/185.17 |
| 2016/0163386 | A1* | 6/2016 | Hwang | G11C 5/025 |
| | | | | 365/185.12 |
| 2016/0322381 | A1* | 11/2016 | Liu | H01L 27/11573 |

FOREIGN PATENT DOCUMENTS

| | | |
|---|---|---|
| TW | I437686 | 5/2014 |
| TW | I496163 | 8/2015 |

\* cited by examiner

*Primary Examiner* — Peniel M Gumedzoe
*Assistant Examiner* — Christopher Johnson
(74) *Attorney, Agent, or Firm* — McClure, Qualey & Rodack, LLP

(57) ABSTRACT

A memory structure is provided. The memory structure includes a first chip. The first chip has an array region and a periphery region. The first chip includes a first stack and a plurality of through structures. The first stack is disposed in the periphery region. The first stack includes alternately stacked conductive layers and insulating layers. The through structures each include an opening, a dielectric layer and a channel material. The opening is through the first stack. The dielectric layer is disposed on a sidewall of the opening. The channel material is disposed in the opening, and the channel material covers the dielectric layer.

21 Claims, 7 Drawing Sheets

MEMORY STRUCTURE

TECHNICAL FIELD

This disclosure relates to a semiconductor structure, and more particularly to a memory structure.

BACKGROUND

Semiconductor devices have become denser and smaller. Various three-dimensional (3D) memory structures, going with the trend, have been developed. Typically, a 3D memory structure comprises a 3D array of memory cells in the array region. However, the components and devices in the periphery region may keep two-dimensional (2D) structures.

SUMMARY

In this disclosure, a memory structure is provided, wherein the 3D design is applied to a periphery region of the memory structure.

According to some embodiments, the memory structure comprises a first chip. The first chip has an array region and a periphery region. The first chip comprises a first stack and a plurality of through structures. The first stack is disposed in the periphery region. The first stack comprises alternately stacked conductive layers and insulating layers. The through structures each comprise an opening, a dielectric layer and a channel material. The opening is through the first stack. The dielectric layer is disposed on a sidewall of the opening. The channel material is disposed in the opening, and the channel material covers the dielectric layer.

Figure 1A:
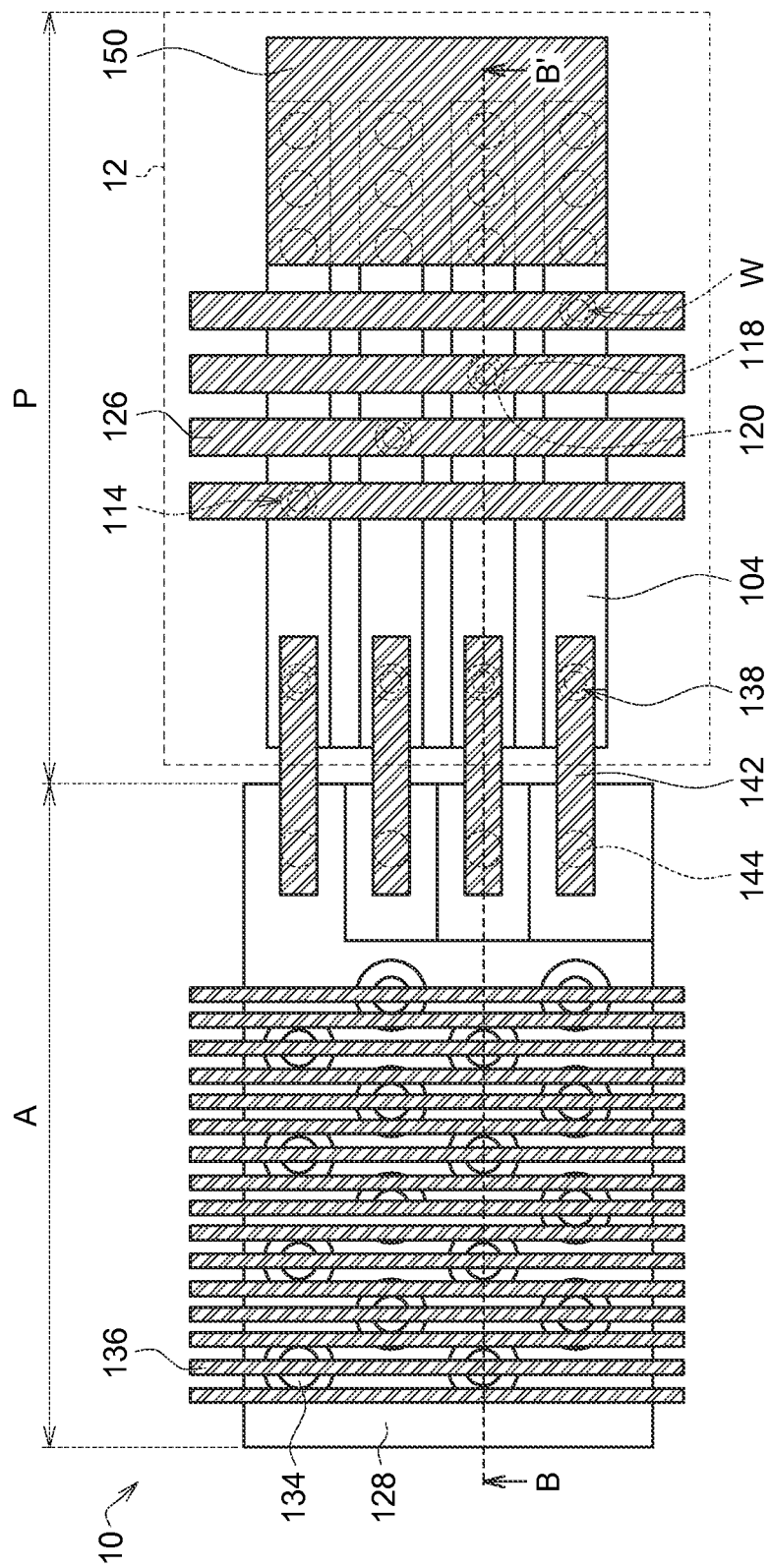
FIGS. 1A-1C schematically show a memory structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. It is noted that, for clarity, the elements in the figures may not be shown according to their real relative sizes. Further, in some figures, the elements that will not to be discussed in the detailed description may be omitted, and some portions of the discussed elements may also be omitted.

Figure 1B:
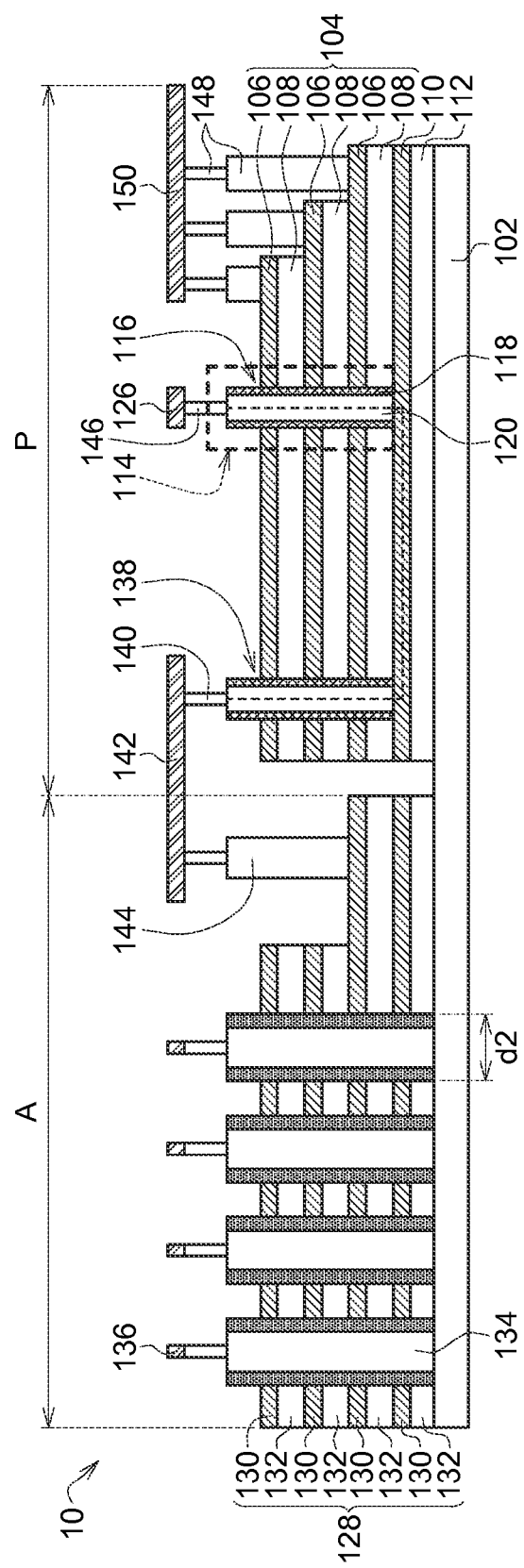
Figure 1C:
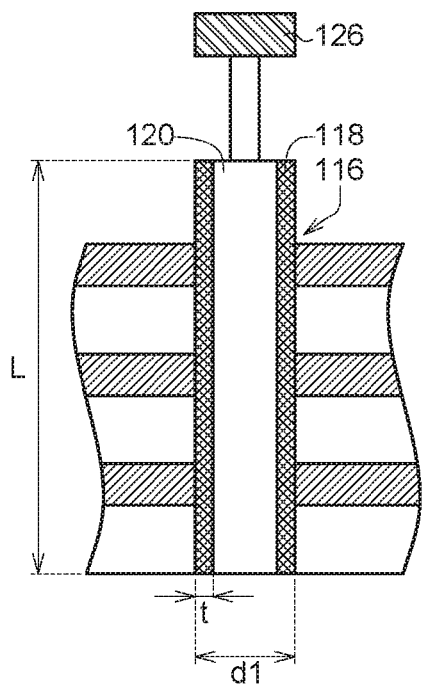

Referring to FIGS. 1A-1C, a memory structure according to one embodiment is schematically shown, wherein FIG. 1B shows a cross-sectional view of the memory structure along line B-B' in FIG. 1A. The memory structure comprises a first chip 10. The first chip 10 has an array region A and a periphery region P. The first chip 10 comprises a first stack 104 and a plurality of through structures 114.

The first stack 104 is disposed in the periphery region P. More specifically, the first chip 10 may comprise a substrate 102, and the first stack 104 is disposed on the substrate 102 in the periphery region P. In some embodiments, as shown in FIG. 1B, the first stack 104 may not be directly disposed on the substrate 102, and at least one conductive layer 110 and/or at least one insulating layer 112 may be disposed between the first stack 104 and the substrate 102. The first stack 104 comprises alternately stacked conductive layers 106 and insulating layers 108. According to some embodiments, a number of the conductive layers 106 of the first stack 104 is larger than 5, preferably larger than 24. It is noted that, in the cases that the conductive layer 110 and the insulating layer 112 are included in the structure, they may be substantially the same as the conductive layers 106 and the insulating layers 108, respectively. That is, the conductive layers 110 and 106 are formed by similar processes and exhibit similar characteristics, and the insulating layers 112 and 108 are formed by similar processes and exhibit similar characteristics.

The through structures 114 each comprise an opening 116, a dielectric layer 118 and a channel material 120. The opening 116 is through the first stack 104. In this embodiment, the opening 116 is a hole. The dielectric layer 118 is disposed on a sidewall of the opening 116. The channel material 120 is disposed in the opening 116 and covers the dielectric layer 118. In this embodiment, the channel material 120 fills the opening 116. An enlarged view of a through structure 114 is shown in FIG. 1C. As shown in FIG. 1C, the dielectric layer 118 has a thickness t. The thickness t is preferably larger than 250 Å. The channel material 120 has a channel length L. The channel length L is preferably larger than 1 μm.

An exemplary structure that may be disposed in the array region A is also shown in FIGS. 1A-1B. However, other memory array structures, particularly other 3D memory array structures, may also be applied. As shown in FIGS. 1A-1B, the first chip 10 may further comprise a second stack 128 and a plurality of strings 134.

The second stack 128 is disposed in the array region A. More specifically, the second stack 128 is disposed on the substrate 102 in the array region A. The second stack 128 comprises alternately stacked conductive layers 130 and insulating layers 132. The strings 134 are through the second stack 128. A 3D array of memory cells are defined by cross portions of the strings 134 and the conductive layers 130 of the second stack 128. According to some embodiments, the conductive layers 130 of the second stack 128 may be configured as a string select line, local word lines and/or a ground select line. For example, the top conductive layer 130 may be configured as a string select line, the bottom conductive layer 130 may be configured as a ground select line, and the other conductive layers 130 may be configured as local word lines. At the same time, bit lines 136 may be provided on the strings 134, and global word lines 126 may be provided on the through structures 114.

Preferably, the first stack 104 and the second stack 128 are formed by the same processes. It results in a structure in which the conductive layers 106 of the first stack 104 and the conductive layers 130 of the second stack 128 are formed of a same material and disposed at same levels, and the insulating layers 108 of the first stack 104 and the insulating layers 132 of the second stack 128 are formed of a same material and disposed at same levels. Further, the processes for forming the through structures 114 and the processes for forming the strings 134 may be compatible. Still further, in some embodiments, the bit lines 136 and the global word lines 126 are formed by the same metal layer. As such, the process time and cost can be saved. It is noted that the through structures 114 may have a first diameter d1 (shown in FIG. 1C), the strings 134 may have a second diameter d2 (shown in FIG. 1B), and the first diameter d1 may be larger than the second diameter d2, so as to provide a larger channel width W.

According to some embodiments, each through structure 114 provides a multi-layer gate structure. In some cases, the top side may be drain side, and the bottom side may be source side. In some embodiments, the through structures 114 may be provided for local word line drivers. More specifically, the memory structure may comprise at least one local word line driver. A local word line driver may comprise one through structure 114. Alternatively, a local word line driver may comprise two or more through structures 114 that are connected in parallel. According to some embodiments, the memory structure may comprise a word-line decoder 12 disposed in the periphery region P, wherein the word-line decoder 12 comprises the first stack 104 and the through structures 114. That is, the word-line decoder 12 comprises the at least one local word line driver.

Figure 2:
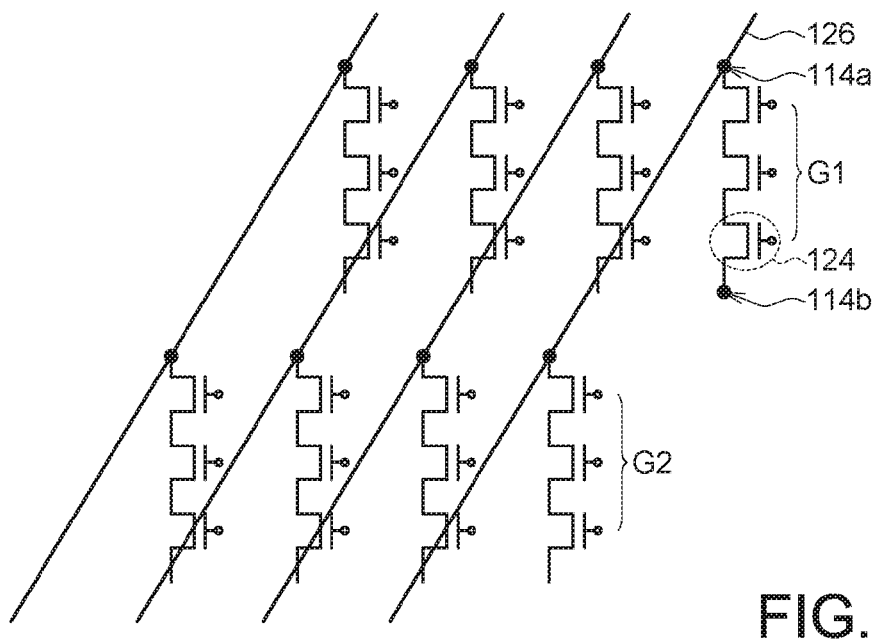
FIG. 2 show a circuit of local word line drivers according to one embodiment.

Referring to FIG. 2, a circuit of the local word line drivers according to one embodiment is shown. A plurality of transistors 124 are formed at cross portions of the channel material 120 and the conductive layers 106 of the first stack 104. Further, each local word line driver may be coupled to a global word line 126 and a local word line, which is disposed in the array region A. For example, a local word line driver may be coupled to a global word line 126 at one end 114a such as by a connector 146, as shown in FIG. 1B. The local word line driver may be coupled to a local word line at the other end 114b such as by a U-shape connecting path (as indicated by the dotted line in FIG. 1B), connectors 140, a connecting line 142 and a connector 144, as shown in FIG. 1B. The U-shape connecting path shown in FIG. 1B comprises the through structure 114, the conductive layer 110 and another through structure 138, which is similar to the through structure 114. The local word line drivers may be provided in different groups G1 and G2 to select different blocks in the array region A. Referring back to FIG. 1B, in some embodiments, the conductive layers 106 corresponding to the through structures 114 may be coupled to a block selector by connectors 148 and a connecting layer 150.

Figure 3:
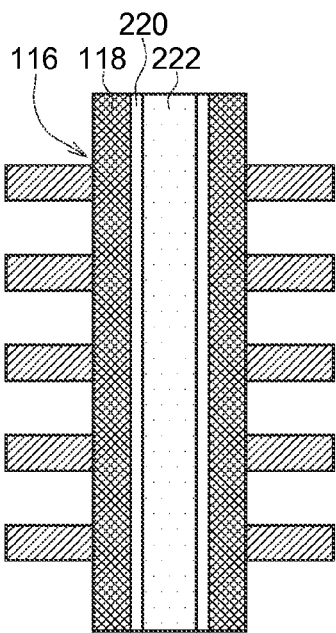
FIG. 3 schematically shows a through structure according to one embodiment.
Figure 4:
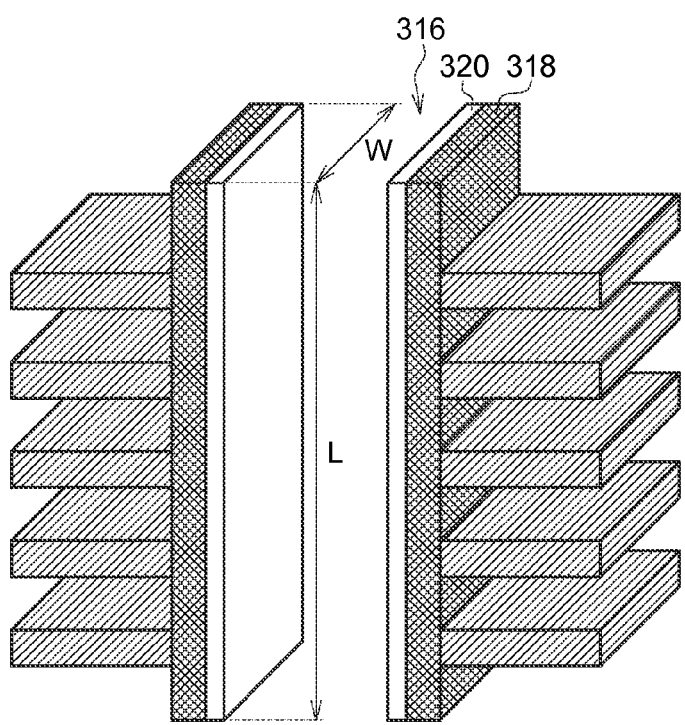
FIG. 4 schematically shows a through structure according to one embodiment.
Figure 5:
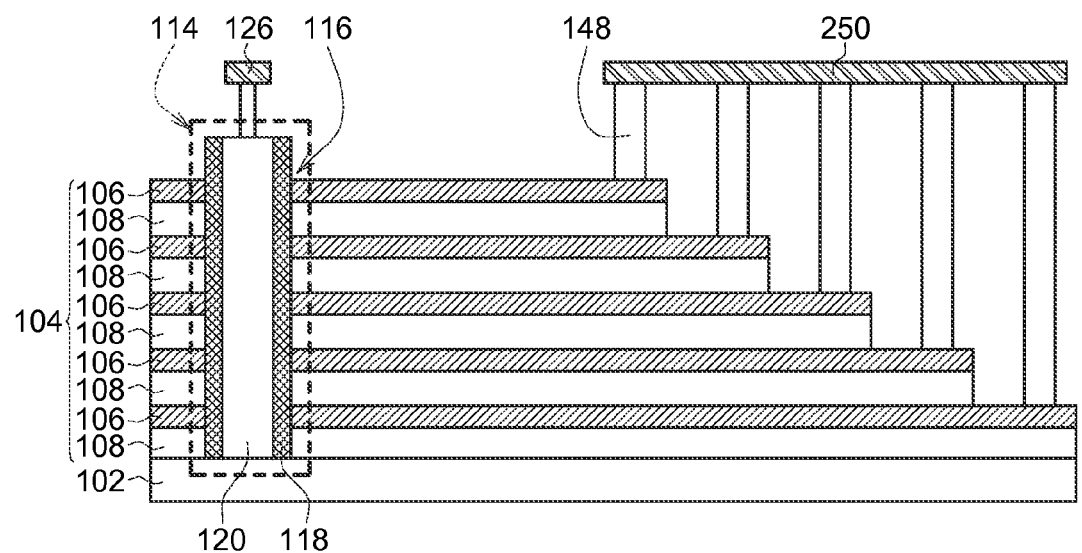
FIG. 5 schematically shows a periphery region of a memory structure according to one embodiment.
Figure 6:
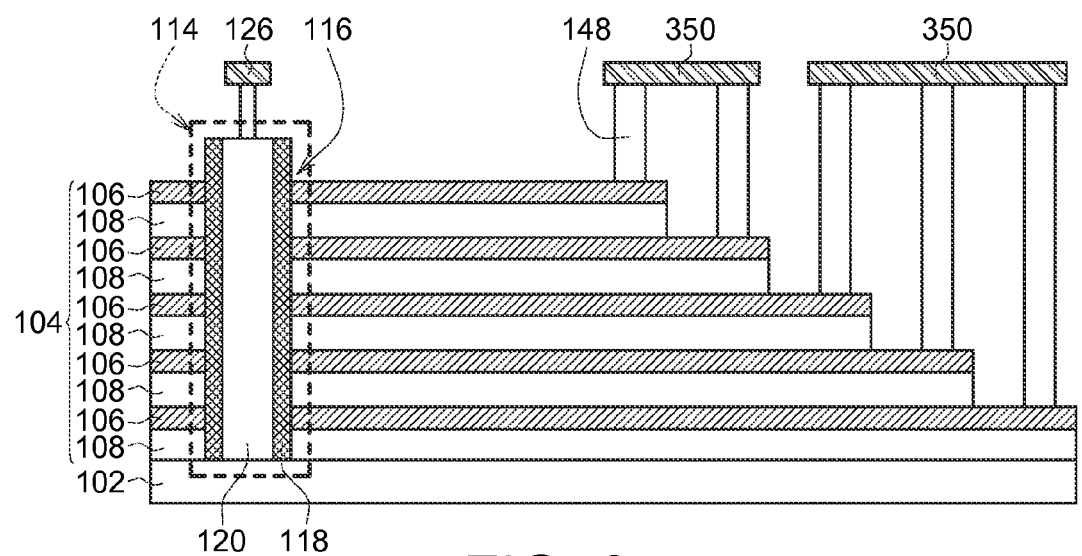
FIG. 6 schematically shows a periphery region of a memory structure according to one embodiment.
Figure 7:
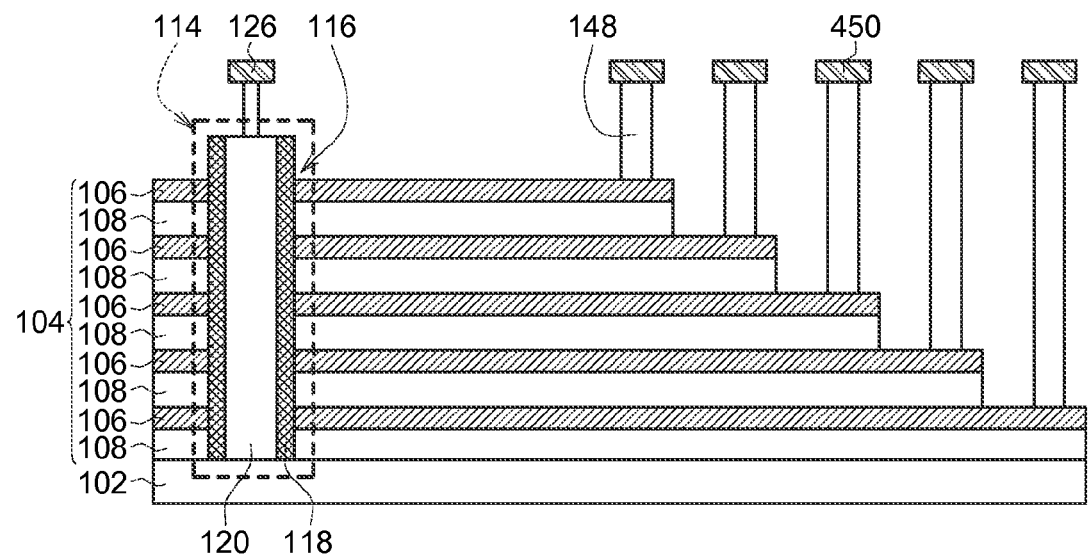
FIG. 7 schematically shows a periphery region of a memory structure according to one embodiment.

Now referring to FIG. 3 and FIG. 4, other types of the through structures 214 and 314 are provided. In the embodiment shown in FIG. 3, the channel material of the through structure 214 forms only a thin channel layer 220 on the dielectric layer 118. The through structure 214 further comprises an insulating material 222. The insulating material 222 fills the opening 116 and covers the channel layer 220 formed by the channel material. In the embodiment shown in FIG. 4, the opening 316 of the through structure 314 is a trench. Two dielectric layers 318 may be formed on the opposite sidewalls of the trench, respectively. The channel material may be disposed along the two dielectric layers 318 and forms two channel layers 320 thereon. At this time, the channel width W depends on how long the trench extends.

Figure 8:
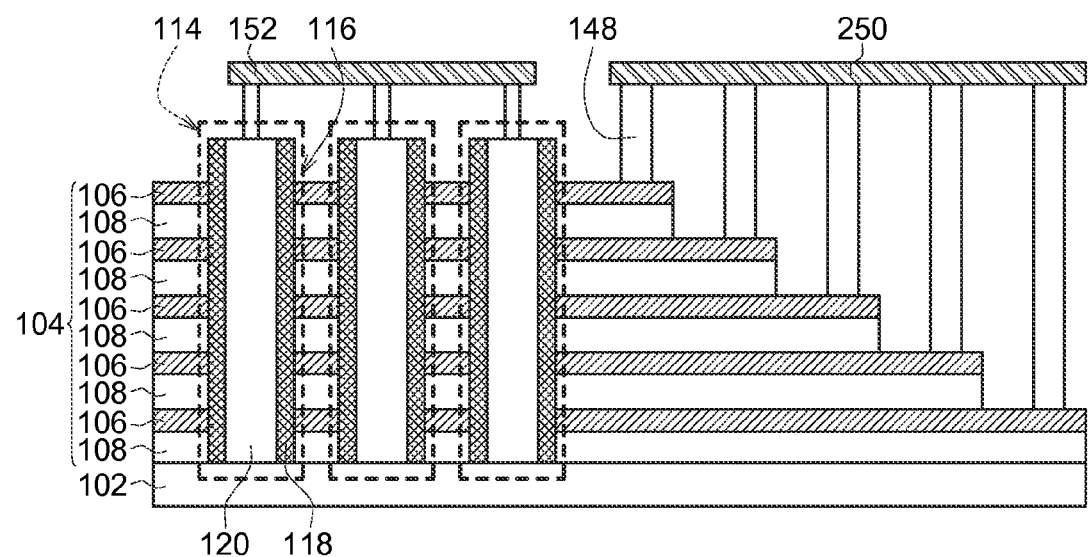
FIG. 8 schematically shows a periphery region of a memory structure according to one embodiment.

FIGS. 5-8 show various arrangements for the first stack 104 and the through structures 114 that may be applied. In the embodiment shown in FIG. 5, the conductive layers 106 corresponding to one through structure 114 are all coupled together, for example, by the connecting layer 250. As such, the multi-layer gate structure may have a common gate. In the embodiment shown in FIG. 6, the conductive layers 106 corresponding to one through structure 114 are partially coupled together, for example, by the connecting layer 350. As such, the multi-layer gate structure may have partial common gates. In the embodiment shown in FIG. 7, the conductive layers 106 corresponding to one through structure 114 are not coupled to one another. That is, the connecting layer 450 is separated into several parts that are individually connected to the conductive layers 106, respectively. As such, the multi-layer gate structure may have individually controlled gates. In the embodiment shown in FIG. 8, similar to the embodiment shown in FIG. 5, the conductive layers 106 corresponding to one through structure 114 are all coupled together. However, two or more through structures 114 are connected together, for example, by the connecting layer 152. In particular, the through structures 114 may be connected in parallel, so as to obtain a longer total channel width, and thereby a higher current. For example, as shown in FIG. 8, three through structures 114 are connected in parallel, a total channel width is three times the perimeter of channel material 120, and thereby a larger current may be obtained.

According to the embodiments described above, a local word line driver formed in a 3D structure can be provided. For passing a high voltage, which is typically used as an operation voltage, from the global word line to the local word line, the local word line driver preferably is a high voltage MOS device. Typically, the operation condition of the local word line driver, which is the "final" transistor of the word-line decoder, is higher than 20 V. As such, the local word line driver preferable has a long channel and a thick gate. In a 2D structure, a large area may be needed. While according to this disclosure, the local word line driver is formed in a 3D structure. According to the embodiment described herein, the long channel extends in a vertical direction, and the area needed can be shrunk.

Figure 9:
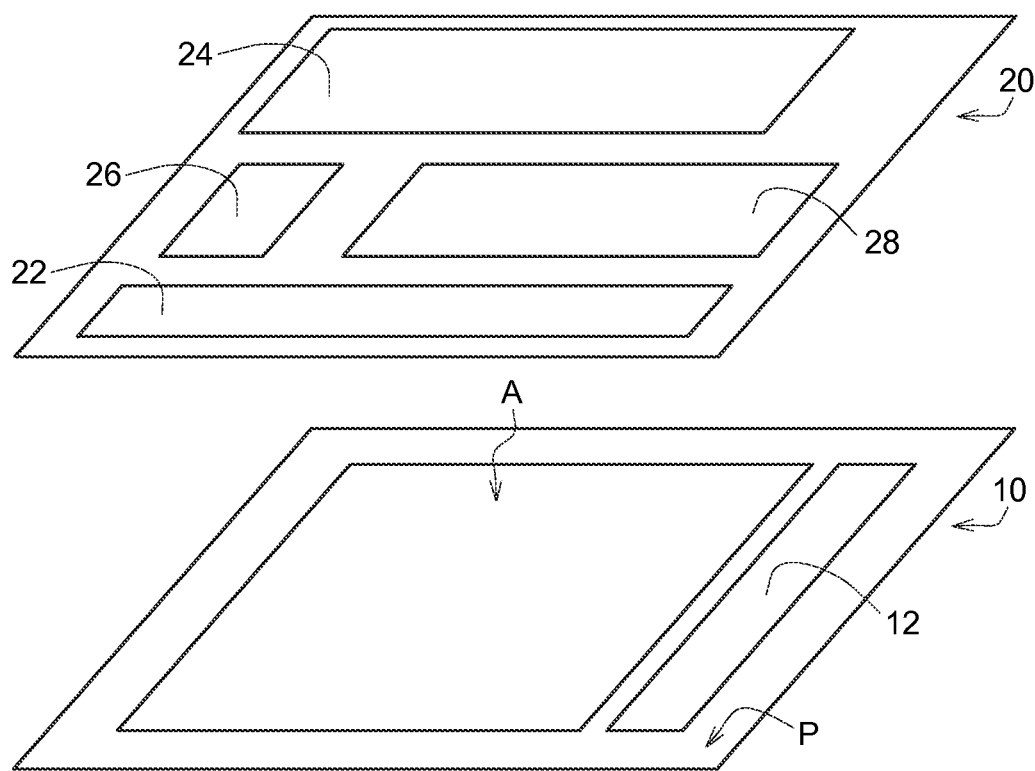
FIG. 9 schematically shows a memory structure according to one embodiment.

Due to the disposition of the local word line drivers, a number of the connecting lines out from the word-line decoder can be significantly decreased. As such, the embodiment described herein may also be applied in an "off-chip" memory design. As shown in FIG. 9, the memory structure may further comprise a second chip 20. The second chip 20 is coupled to the first chip 10. The second chip 20 may comprise a bit-line decoder 22, a page buffer 24, a state machine 26, a peripheral circuitry 28 and/or other components and devices that are typically disposed in the periphery region of a memory. Typically, these components and devices are formed by processes different from those used for manufacturing the 3D memory array in the array region. As such, by forming them on a different chip, the process may be simplified. Further, since the components and devices needed to be formed in the substrate is now on another chip, the substrate 102 of the first chip 10 may not be formed of silicon wafer. For example, the substrate 102 of the first chip 10 may formed of silicon dioxide. As such, the cost may be decreased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
a first chip having an array region and a periphery region, the first chip comprising:
a first stack disposed in the periphery region, the first stack comprising alternately stacked conductive layers and insulating layers; and
a plurality of through structures each comprising:
an opening through the first stack;
a dielectric layer disposed on a sidewall of the opening; and
a channel material disposed in the opening, the channel material covering the dielectric layer;
wherein the memory structure further comprises a word-line decoder disposed in the periphery region, and the word-line decoder comprises the first stack and the through structures.

2. The memory structure according to claim 1, wherein each of the through structures further comprises:
an insulating material filling the opening and covering a channel layer formed by the channel material.

3. The memory structure according to claim 1, wherein the channel material fills the opening.

4. The memory structure according to claim 1, wherein the opening is a hole or a trench.

5. The memory structure according to claim 1, wherein the channel material has a channel length larger than 1 μm.

6. The memory structure according to claim 1, wherein the dielectric layer has a thickness larger than 250 Å.

7. The memory structure according to claim 1, wherein a number of the conductive layers of the first stack is larger than 5.

8. The memory structure according to claim 1, wherein two or more of the through structures are connected in parallel.

9. The memory structure according to claim 1, wherein the conductive layers corresponding to one of the through structures are all coupled together.

10. The memory structure according to claim 1, wherein the conductive layers corresponding to one of the through structures are partially coupled together.

11. The memory structure according to claim 1, wherein the conductive layers corresponding to one of the through structures are not coupled to one another.

12. The memory structure according to claim 1, wherein a plurality of transistors are formed at cross portions of the channel material and the conductive layers of the first stack.

13. The memory structure according to claim 1, further comprising:
at least one local word line driver each comprising:
one of the through structures; or
two or more of the through structures that are connected in parallel.

14. The memory structure according to claim 13, wherein each of the at least one local word line driver is coupled to a global word line and a local word line.

15. The memory structure according to claim 1, wherein the first chip further comprising:
a second stack disposed in the array region, the second stack comprising alternately stacked conductive layers and insulating layers; and
a plurality of strings through the second stack;
wherein a 3D array of memory cells are defined by cross portions of the strings and the conductive layers of the second stack.

16. The memory structure according to claim 15, wherein each of the conductive layers of the second stack is configured as a string select line, a local word line or a ground select line.

17. The memory structure according to claim 15, wherein the conductive layers of the first stack and the conductive layers of the second stack are formed of a same material and disposed at same levels, and the insulating layers of the first stack and the insulating layers of the second stack are formed of a same material and disposed at same levels.

18. The memory structure according to claim 15, wherein the through structures have a first diameter, the strings have a second diameter, and the first diameter is larger than the second diameter.

19. The memory structure according to claim 1, further comprising:
a second chip coupled to the first chip, the second chip comprising at least one of a bit-line decoder, a page buffer, a state machine and a peripheral circuitry.

20. A memory structure, comprising:
a first chip having an array region and a periphery region, the first chip comprising:
a first stack disposed in the periphery region, the first stack comprising alternately stacked conductive layers and insulating layers; and
a plurality of through structures each comprising:
an opening through the first stack;
a dielectric layer disposed on a sidewall of the opening; and
a channel material disposed in the opening, the channel material covering the dielectric layer;
wherein the memory structure further comprises at least one local word line driver each comprising:
one of the through structures; or
two or more of the through structures that are connected in parallel;
wherein each of the at least one local word line driver is coupled to a global word line and a local word line.

21. A memory structure, comprising:
a first chip having an array region and a periphery region, the first chip comprising:
a first stack disposed in the periphery region, the first stack comprising alternately stacked conductive layers and insulating layers;
a plurality of through structures each comprising:
an opening through the first stack;
a dielectric layer disposed on a sidewall of the opening; and
a channel material disposed in the opening, the channel material covering the dielectric layer;
a second stack disposed in the array region, the second stack comprising alternately stacked conductive layers and insulating layers; and
a plurality of strings through the second stack, wherein a 3D array of memory cells are defined by cross portions of the strings and the conductive layers of the second stack;
wherein the through structures have a first diameter, the strings have a second diameter, and the first diameter is larger than the second diameter.

* * * * *